(12) United States Patent
Alexander et al.

(10) Patent No.: US 6,188,602 B1
(45) Date of Patent: Feb. 13, 2001

(54) MECHANISM TO COMMIT DATA TO A MEMORY DEVICE WITH READ-ONLY ACCESS

(75) Inventors: Marc D. Alexander; Todd Martin, both of Austin, TX (US)

(73) Assignee: Dell USA, L.P., Round Rock, TX (US)

( * ) Notice: Under 35 U.S.C. 154(b), the term of this patent shall be extended for 0 days.

(21) Appl. No.: 09/491,167

(22) Filed: Jan. 25, 2000

(51) Int. Cl.[7] ................................................. G11C 16/04
(52) U.S. Cl. ................................. 365/185.04; 365/185.33
(58) Field of Search ........................ 365/185.04, 185.33, 365/185.08, 185.22, 185.23

(56) References Cited

U.S. PATENT DOCUMENTS

| | | | |
|---|---|---|---|
| 5,297,148 | * | 3/1994 | Harari et al. .................... 371/10.2 |
| 5,732,251 | * | 3/1998 | Shinohara .......................... 371/40.2 |
| 5,822,251 | * | 10/1998 | Bruce et al. .................... 365/185.33 |
| 5,826,205 | * | 10/1999 | Koelle et al. ............................ 701/29 |
| 5,877,986 | * | 3/1999 | Harari et al. .................... 365/185.33 |
| 6,026,016 | * | 2/2000 | Gafken ............................ 365/185.04 |
| 6,092,160 | * | 7/2000 | Marster ................................. 711/156 |

* cited by examiner

*Primary Examiner*—Amir Zarabian
*Assistant Examiner*—Anh Phung
(74) *Attorney, Agent, or Firm*—Skjerven Morrill MacPherson LLP; Stephen A. Terrile; Mary Jo Bertani

(57) ABSTRACT

An apparatus for accessing locked-down flash memory in a computer system that utilizes a general purpose input/output port coupled to the flash memory, and includes program instructions that generate a reset signal, output the reset signal to the general purpose input/output port, sense the reset signal, unlock the flash memory to allow write access to the flash memory, update the flash memory, and lock the flash memory to locked down mode. The present invention allows flash memory to be updated during normal operation of the computer system.

24 Claims, 4 Drawing Sheets

MECHANISM TO COMMIT DATA TO A MEMORY DEVICE WITH READ-ONLY ACCESS

BACKGROUND OF THE INVENTION

1. Field of the Invention

This invention relates generally to semiconductor electrically erasable programmable read only memories, and specifically to a system for locking and unlocking flash memory to write data to the flash memory at selected times.

2. Description of the Related Art

In electrically erasable programmable read-only memory (EEPROM) known as flash memory, there is a software command sequence which can be used to erase all or part of the EEPROM memory device. This software command sequence is typically used to erase the device prior to re-programming and is very useful to update system software such as the basic input/output system (BIOS). Problems may arise, however, when the erase feature is used, either unintentionally or maliciously, to erase memory storing critical computer functions. Such erasures may be caused by programming errors or by viruses that are implanted maliciously to disable system operation.

Some flash memory systems include software and/or hardware features that allow flash memory to be unlocked during initialization of the computer system, and then re-locked once initialization is complete to protect the contents of the flash memory. Often, memory may be locked and unlocked on a block by block basis. This enables technology, such as plug and play, where hardware changes made while the computer system is powered down are automatically configured into the computer system during subsequent power-up initialization, thereby considerably reducing the complexity of making hardware changes for the user and improving system reliability.

Intel Corporation's 82802 firmware hub currently uses flash memory with two levels of status where the flash memory cannot be overwritten: write-locked and locked-down. The locked-down state prevents further set or clear operations to the write-lock and read-lock bits of the flash memory and provides the most protection from unauthorized erasures or overwriting. It is not possible to go from locked-down status to unlocked status without first powering down or resetting the computer system, however. The write-lock bit has similar limitations, as it must be set to the desired protection state prior to starting a program or erase operation and is sampled only at the beginning of the operation.

As computer system capability, as well as proliferation of malicious hacking and computer viruses increase, it is important to be able to update flash memory without interrupting operation of the computer system, and then to place it back in locked-down status once the update is complete for maximum security. Therefore, it is desirable to provide the capability to lock critical portions of flash memory to prevent it from being corrupted during initialization as well as during normal operation of the computer system.

SUMMARY OF THE INVENTION

The present invention provides a mechanism to reset flash memory to locked status without rebooting or powering down the computer system. This provides an advantage over the prior art in situations when it is desirable to update or change protected information residing in flash memory without interrupting operation of the computer system.

In one embodiment, the present invention provides a method for updating flash memory in a computer system during operation of the computer system when the flash memory is in a read only state, such as locked-down mode. The computer system includes a general purpose input/output port is coupled to reset circuitry for the flash memory. The method includes generating a reset signal, outputting the reset signal on a general purpose input/output port, sensing the reset signal, unlocking the flash memory to allow write access to the flash memory, updating the flash memory; and locking the flash memory to locked down mode.

In another embodiment, the present invention provides a computer system that includes a processor, a flash memory coupled to the processor, a general purpose input/output port coupled to the flash memory, first program instructions operable to generate a reset signal, output the reset signal to the general purpose input/output port, wherein the general purpose input/output port is coupled to reset circuitry for the flash memory, sense the reset signal, unlock the flash memory to allow write access to the flash memory, update the flash memory, and lock the flash memory to locked down mode.

In yet another embodiment, the present invention provides an apparatus for accessing locked-down flash memory in an operating computer system utilizing a general purpose input/output port coupled to the flash memory, and includes program instructions that generate a reset signal, output the reset signal to the general purpose input/output port, sense the reset signal, unlock the flash memory to allow write access to the flash memory, update the flash memory, and lock the flash memory to locked down mode. The program instructions are executed during normal operation of the computer system.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

Figure 1:
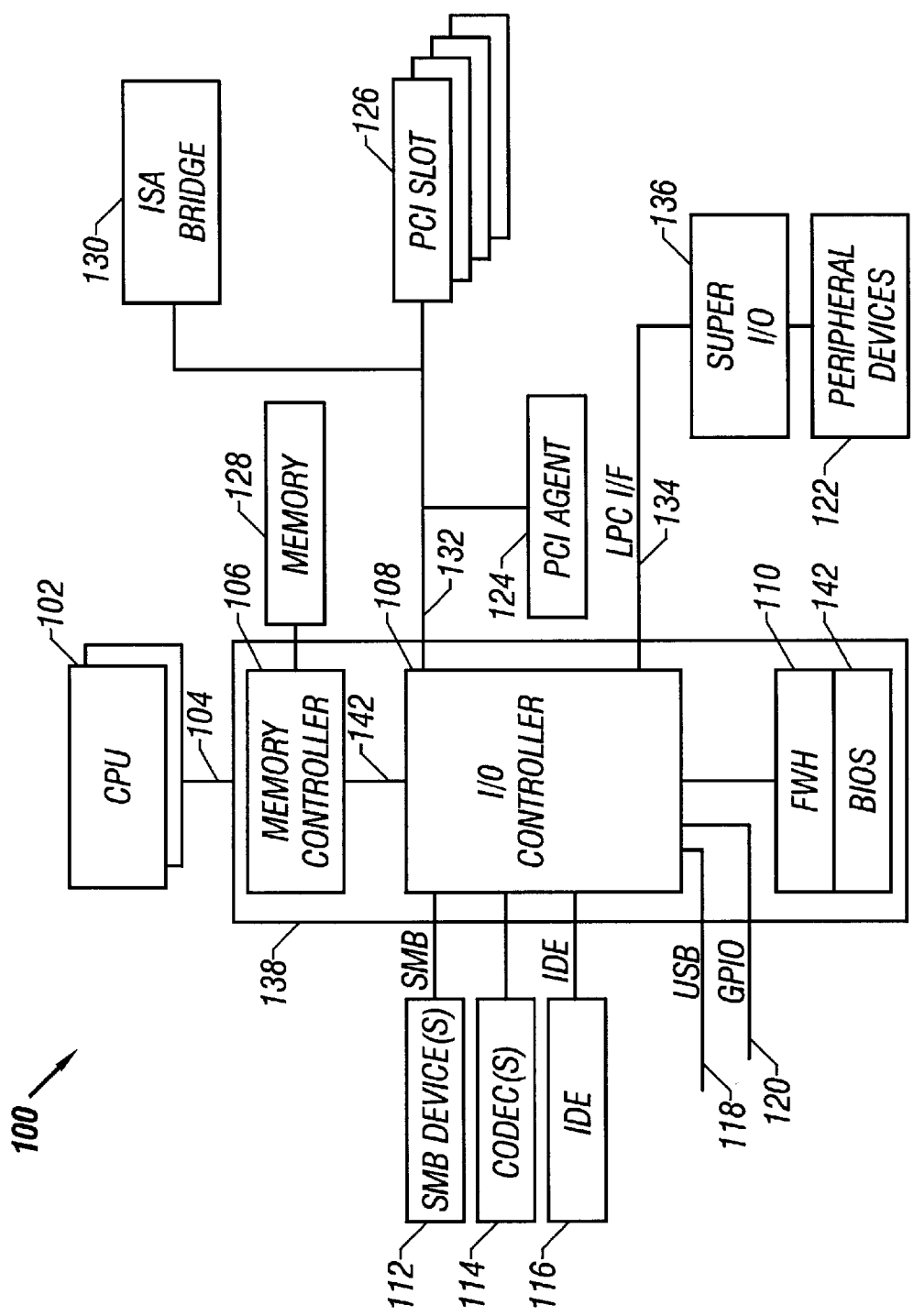
FIG. 1 is a block diagram of a computer system.

FIG. 1 is a simplified block of computer system 100 with which the present invention for unlocking flash memory and then re-locking the flash memory once the desired operation is complete may be utilized. Computer system 100 includes one or more central processing units (CPU) 102 coupled to host bus 104 to communicate with memory controller 106, input/output (I/O) controller 108, and firmware hub 110. System management bus (SMB) devices 112, audio encoder/decoder (codec) unit 114, and integrated disk electronics (IDE) disk drives 116 are coupled via corresponding communication busses to I/O controller 108. Additional communication connections couple a variety of other devices to I/O controller 108 including universal serial bus (USB) devices 118, one or more general purpose I/O (GPIO) registers 120, lower pin count (LPC) devices 122, and peripheral component interconnect (PCI) agents 124 and devices in PCI slots 126, as known in the art. Memory 128 is coupled for communication with memory controller 106, including cache memory and main memory control functions.

PCI bus 120 provides an interface for a variety of PCI agents 126 and devices in PCI slots 128 including, for example, a local area network (LAN) card (not shown). PCI to industry standard architecture (ISA) bridge 130 provides bus control to handle transfers between PCI bus 132 and an ISA bus (not shown) via ISA bridge 130, and can include other functional elements not shown, such as power management functionality, real-time clock (RTC), direct memory access (DMA) control, and interrupt support. Peripheral devices and input/output (I/O) devices can be attached to various interfaces coupled to ISA bridge 130 via the ISA bus. Alternatively, many I/O devices can be accommodated by I/O controller 106. I/O devices such as a modem (not shown) are coupled to the appropriate I/O interface, for example a serial interface on the ISA bus. LPC interface 134 is designed to facilitate transition toward future systems that will not include ISA in their architecture. LPC interface 134 allows the I/O components, typically integrated in super I/O chip 136, to migrate from the ISA bus to LPC interface 134.

Memory controller 106, I/O controller 108, and firmware hub 110 form chipset 138 which is implemented, for example, in the 810E chipset manufactured by Intel Corporation of Santa Clara, Calif. In chipset 138, memory controller 106 includes built-in graphics processing technology and software drivers. System manageability bus (SMB) 140 allows monitoring of critical system parameters such as cooling fan speed, input voltages, and temperatures. I/O controller 108 employs accelerated controller hub architecture which connects directly to memory controller 106, audio codes 114, IDE drives 116, USB devices 118, and PCI devices 126, thereby providing high bandwidth data transfers among components in computer system 100. Firmware hub 110 stores system and video basic input/output systems (BIOS) 142, generates random numbers for security features, provides register-based read and write protection for code/data storage blocks, and includes a command user interface (CUI) for requesting access to locking, programming, and erasing options in firmware hub 110. The CUI also handles requests for data residing in status, identification, and block lock registers. BIOS 142 is implemented in flash memory in firmware hub 110 to support capabilities, such as plug and play, that automatically update system parameters and software when hardware is added or changed in computer system 100.

Figure 2:
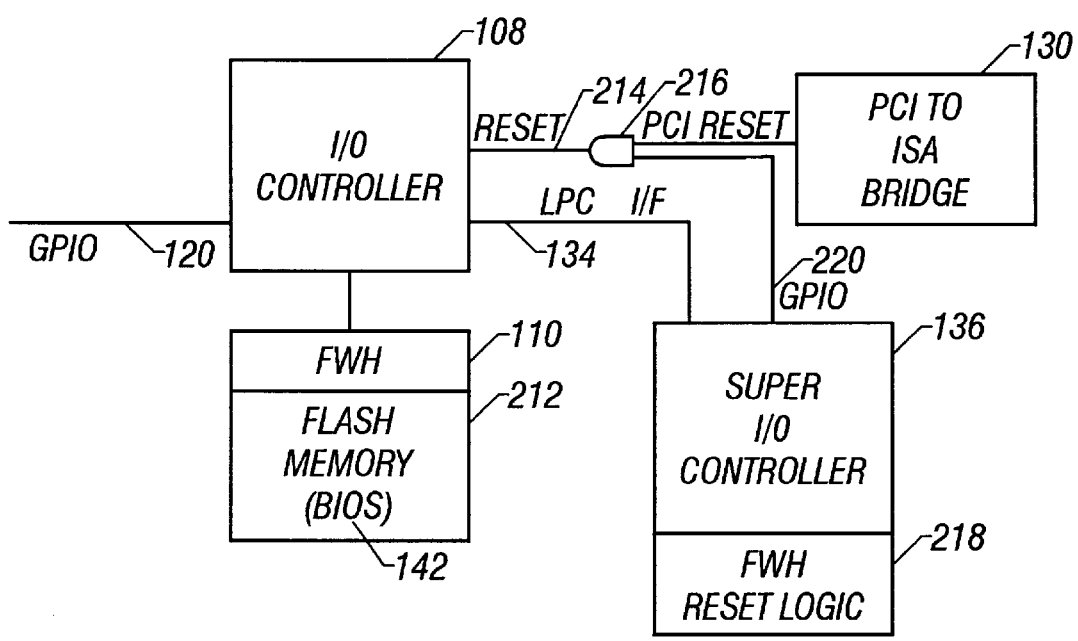
FIG. 2 is a diagram of flash memory connections to a portion of the computer system.

FIG. 2 shows I/O controller 108 coupled for communication with firmware hub (FWH) 110 and super I/O controller 136. Flash memory 212 in firmware hub 110 includes a locking scheme with three levels of locking status: locked, unlocked, and lock-down. The default status of all blocks in flash memory 212 upon power-up or reset is locked. Locked blocks are fully protected from alteration. Any program or erase operations attempted on a locked block will return an error. The status of a locked block can be changed to unlocked or lock-down using appropriate software commands. An unlocked block can be locked by writing a lock command sequence.

Unlocked blocks can be programmed or erased. All unlocked blocks return to the locked state when the device is reset or powered down. The status of an unlocked block can be changed to locked or locked-down using appropriate software commands. A locked block can be unlocked by writing an unlock command sequence.

Blocks that are locked-down are protected from program and erase operations, just like locked blocks, but their protection status cannot be changed using software commands alone. A locked or unlocked block can be locked-down by writing a lock-down command sequence. Locked-down blocks revert to locked status when the computer system is reset or powered down.

Several signals control access by I/O controller 108 to flash memory 212 in firmware hub 110. Firmware hub 110 receives input voltage supply $V_{pp}$ from the power supply (not shown) to control erasure and programming of flash memory 212 by controlling lock status. A write enable signal controls writes to a command register and memory array in flash memory 212. An output enable signal enables output from flash memory 212 during a read operation. A chip enable signal activates internal control logic, input buffers, decoders, and sense amplifiers (not shown) in firmware hub 110. Memory addresses and data input/output signals are communicated for storing received data and transmitting requested data between I/O controller 108 and firmware hub 110.

A PCI reset signal 214 is transmitted to I/O controller 108 through OR gate 216. The present invention includes firmware hub reset logic 218, which sets reset signal 214 that is transmitted to I/O controller 108 via GPIO port 220 and OR gate 216. This feature allows flash memory 212 to be taken out of locked-down status and updated without re-booting or powering down computer system 100.

When reset signal 214 is set at one level, it is in reset/deep power-down mode, and when it is set at another level, it is in standard operation. When reset signal 214 transitions from reset/deep power down to standard operation, flash memory 212 resets all blocks to locked status, regardless of their status prior to reset. In the prior art, reset signal 214 was only set to reset or power down by logic in PCI to ISA bridge 130 when computer system 100 was re-booted (reset) or powered down. The user had to wait until the system re-booted to use computer system 100 again and restart any application programs from the beginning. Further, any information residing in flash memory 212 that was not saved before rebooting was lost and the user had to re-trace his or her steps to recreate the same information.

The present invention provides a mechanism to reset flash memory 212 to locked status without rebooting or powering down computer system 100. This provides an advantage over the prior art in situations when it is desirable to update or change protected information residing in flash memory 212 without interrupting operation of computer system 100. Such situations arise, for example, in storing resource information including adapter card information, serial numbers of memory expansion boards, system passwords, property ownership tags, and network identifiers, in flash memory 212. It is anticipated that further hardware and software developments will present even more situations where the need to update flash memory without interrupting operation of computer system 100.

Application and system level instructions stored in memory 128 (FIG. 1) or a mass storage device (not shown) are loaded and executed in CPU 102 as required by computer system's 100 operating system or as requested by the user. As the instructions require write access to information stored in flash memory 212, GPIO port 220 is used to reset flash memory 212 to unlocked mode (i.e., write mode) without requiring shutdown or re-booting of computer system 100. Flash memory 212, upon sensing a pulse in reset signal 214, resets the lock/unlock logic, making flash memory 212 writeable.

Figure 3:
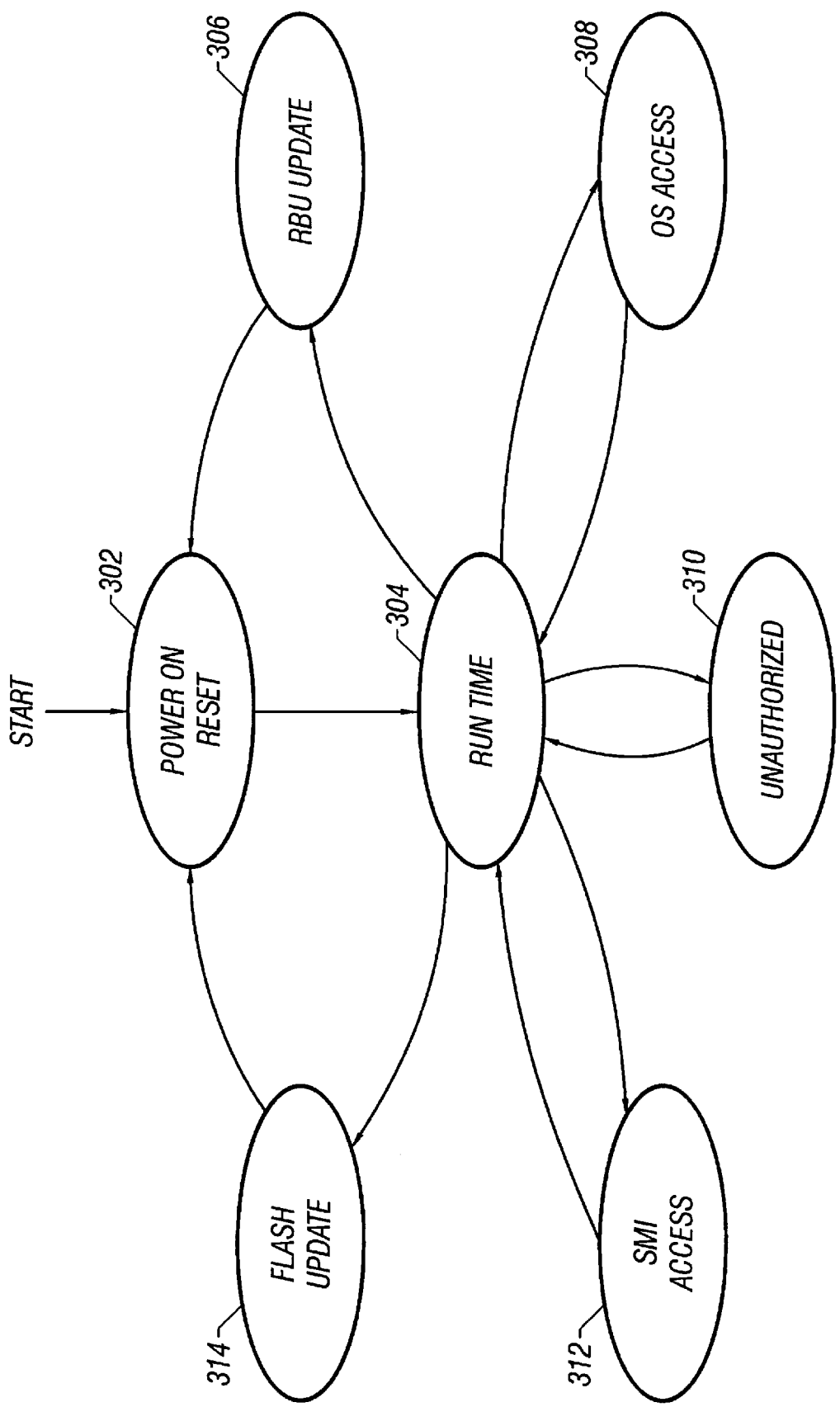
FIG. 3 is an upper level state diagram of a method for locking and unlocking flash memory in accordance with the present invention.

FIG. 3 shows a state diagram of an overview of firmware reset logic 218 (FIG. 2) for unlocking and locking-down flash memory without re-booting or powering down computer system 100. When computer system 100 is initially powered on, flash memory 212 enters power on reset state 302 until BIOS 142 finishes a power on self test, and resets all blocks in flash memory 212 to locked status. BIOS 142 then passes control to run state 304.

There are several states flash memory 212 may enter from run state 304, depending on the function being executed. Specifically, when an update to BIOS 142 is requested from a remote application or operating system instruction, flash memory enters remote BIOS update (RBU) state 306. When the update is complete, computer system 100 passes control from RBU state 306 to power on reset state 302 to perform the power on self test, resets all blocks in flash memory 212 to locked status, and passes control to run state 304.

Flash memory 212 enters operating system access state 308 from run state 304 when the operating system in computer system 100 accesses shared space in flash memory 212. Unauthorized state 310 is entered from run state 304 when an unauthorized program attempts to access flash memory 212. System management interrupt state 312 is entered when a system management program requests an update of information in flash memory 212. Flash update state 314 is entered when the flash memory program is updated/changed. When the flash program is finished executing, control is passed to power on reset state 302.

Figure 3A:
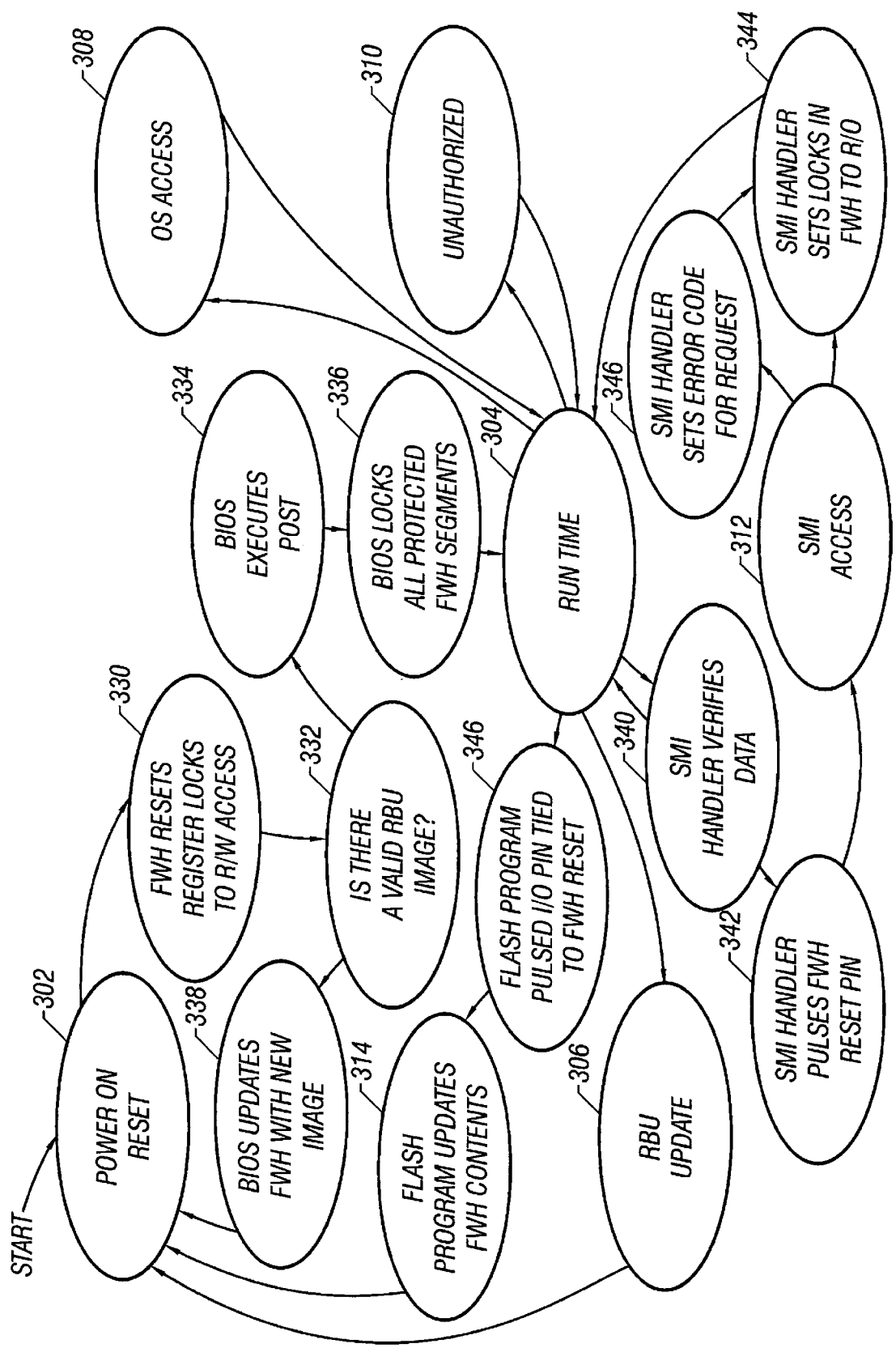
FIG. 3a is a lower level state diagram of a method for locking and unlocking flash memory in accordance with the present invention.

Transitions between states 302 through 314 is shown in further detail in FIG. 3a. Powering on computer system 100 puts flash memory 212 in power on reset state 302. If adequate power is being supplied, flash memory 212 enters state 330 where flash memory 212 in firmware hub 110 is reset to read/write access. Flash memory 212 then enters state 332 to check whether there is a valid RBU image to update BIOS 142. If a valid RBU image does not exist, flash memory 212 enters state 334 where BIOS 142 executes a power on self-test. Control is then transferred to state 336 where BIOS 142 puts all protected blocks in firmware hub 110 in locked status before passing control to computer system's 100 operating system and entering run state 304. If a valid RBU image exists, flash memory 212 enters state 338 where BIOS 142 updates firmware hub 110 with a new BIOS image and then enters state 302 to load the new image by resetting computer system 100.

From run state 304, flash memory 212 will enter operating system access state 308 when the operating system requests access to flash memory 212. The operating system is only allowed to update shared, unlocked blocks of flash memory 212. Once access is complete, flash memory 212 returns to run state 304.

Flash memory 212 enters unauthorized state 310 from run state 304 when a program attempts to access flash memory 212 without authorization or privilege. When this occurs, the memory locations are protected from write access and control returns to run state 304.

When a system management interrupt (SMI) is requested, flash memory transitions from run state 304 to state SMI access state 312, by first transitioning through state 340 to verify the data and state 342 to unlock flash memory 212 by outputting a reset pulse to firmware hub 110. Once the SMI handler updates the requested information successfully, control transitions to state 344 to lock flash memory 212. If an error occurs in attempting to update the information, control transitions to state 346 where an error code is set and then to state 344 to lock flash memory 212. Control then transitions back to run state 304 with a completion code indicating whether the SMI access was successful or not.

Flash memory 212 transitions from run state 304 to power on state 302 to reset computer system 100 through either RBU state 306 or flash update state 314. When an update to BIOS 142 is requested from a remote application or operating system instruction, flash memory enters RBU state 306. When the update is complete, computer system 100 passes control from RBU state 306 to power on reset state 302 to perform the power on self test, resets all blocks in flash memory 212 to locked status, and passes control to run state 304.

When a request to update the flash memory program is received, control transitions from run state 304 to state 346 where FWH reset logic 218 (FIG. 2) generates a reset pulse on GPIO 220 (FIG. 2). Control transitions to state 314 and the program updates information in firmware hub 110. When the flash program is finished executing, control is passed to power on reset state 302.

Advantageously, the present invention provides a mechanism for writing to flash memory 212 without rebooting or powering down computer system 100. Flash memory 212 is placed in read only mode during the initial boot, or power up, process. When an application or operating system program requires write access to flash memory 212, a reset signal is output to GPIO port 220 by firmware hub logic 218. GPIO port 220 is coupled to reset circuitry for flash memory 212 through OR gate 216. Upon sensing the reset pulse, flash memory 212 is reset in read/write mode, thereby allowing information to be written to flash memory 212. When the update is completed, flash memory 212 is returned to locked status to prevent unauthorized access to flash memory 212.

While the invention has been described with respect to the embodiments and variations set forth above, these embodiments and variations are illustrative and the invention is not to be considered limited in scope to these embodiments and variations. For example, the present invention may be used to search and extract content from a wide variety of sites in addition to or instead of vendor sites. For example, flash memory may be included in several locations in computer system 100 to provide a nonvolatile storage media in addition to the flash memory in firmware hub 110. Such uses of flash memory include an ISA bus interface to flash memory embedded on a circuit board, add-in card, and/or in-line memory modules (both single in-line memory modules (SIMMS), and dual in-line memory modules (DIMMs)). Personal Computer Memory Card International Association (PCMCIA) interface allows memory expansion using flash memory PC cards. PCI bus 132 interfaces with flash memory on a PCI add-in card; and the IDE bus interfaces with advance technology attachment (ATA) flash memory. The present invention may be utilized in any system using suitable flash memory in any location. Accordingly, various other embodiments and modifications and improvements not described herein may be within the spirit and scope of the present invention, as defined by the following claims.

What is claimed:

1. A method of updating flash memory in a computer system during operation of the computer system wherein the flash memory is in locked-down mode, the method comprising:

generating a reset signal;

outputting the reset signal on a general purpose input/output port, wherein the general purpose input/output port is coupled to reset circuitry for the flash memory;

sensing the reset signal;

unlocking the flash memory to allow write access to the flash memory;

updating the flash memory; and locking the flash memory to locked down mode.

2. The method of claim 1 wherein the computer system is operating while the method is performed.

3. The method of claim 1 further comprising:

coupling the general purpose input/output port to existing flash memory reset circuitry.

4. The method of claim 1 wherein updating the flash memory includes updating flash memory program instructions.

5. The method of claim 1 wherein updating the flash memory includes updating BIOS program instructions.

6. The method of claim 1 further including generating the reset signal when the operating system requests access to the flash memory.

7. The method of claim 1 further including generating the reset signal when a system management interrupt requests access to the flash memory.

8. The method of claim 1 further including preventing generation of the reset signal when unauthorized access to the flash memory is requested.

9. A computer system comprising:

a processor;

a flash memory coupled to the processor;

a general purpose input/output port coupled to the flash memory;

first program instructions operable to:

generate a reset signal;

output the reset signal to the general purpose input/output port, wherein the general purpose input/output port is coupled to reset circuitry for the flash memory;

sense the reset signal;

unlock the flash memory to allow write access to the flash memory;

update the flash memory; and lock the flash memory to locked down mode.

10. The computer system of claim 9 wherein the computer system is operating while the first program instructions are executed.

11. The computer system of claim 9 wherein the general purpose input/output port is coupled to existing flash memory reset circuitry.

12. The computer system of claim 9 wherein the program instructions update the flash memory program instructions.

13. The computer system of claim 9 wherein the program instructions update the BIOS program instructions.

14. The computer system of claim 9 wherein the program instructions generate the reset signal when the operating system requests access to the flash memory.

15. The computer system of claim 9 wherein the program instructions generate the reset signal when a system management interrupt requests access to the flash memory.

16. The computer system of claim 9 wherein the program instructions prevent generation of the reset signal when unauthorized access to the flash memory is requested.

17. An apparatus for accessing flash memory in a computer system, the apparatus comprising:

a general purpose input/output port coupled to the flash memory;

first program instructions operable to:

generate a reset signal;

output the reset signal to the general purpose input/output port, wherein the general purpose input/output port is coupled to reset circuitry for the flash memory;

sense the reset signal;

unlock the flash memory to allow write access to the flash memory;

update the flash memory; and lock the flash memory to locked down mode.

18. The apparatus of claim 17 wherein the computer system is operating while the first program instructions are executed.

19. The apparatus of claim 17 wherein the general purpose input/output port is coupled to existing flash memory reset circuitry.

20. The apparatus of claim 17 wherein the program instructions update the flash memory program instructions.

21. The apparatus of claim 17 wherein the program instructions update the BIOS program instructions.

22. The apparatus of claim 17 wherein the program instructions generate the reset signal when the operating system requests access to the flash memory.

23. The apparatus of claim 17 wherein the program instructions generate the reset signal when a system management interrupt requests access to the flash memory.

24. The apparatus of claim 17 wherein the program instructions prevent generation of the reset signal when unauthorized access to the flash memory is requested.

* * * * *